United States Patent
Rayne et al.

[11] Patent Number: 6,051,534
[45] Date of Patent: Apr. 18, 2000

[54] PROCESS FOR MAKING SUPERCONDUCTING PBSCCO AND PBSCCO PARTS

[75] Inventors: Roy Rayne, New Carrollton, Md.; Louis E. Toth, Washington, D.C.; Barry A. Bender, Alexandria, Va.; Steven H. Lawrence, Fort Washington, Md.

[73] Assignee: The United States of America as represented by the Secretary of the Navy, Washington, D.C.

[21] Appl. No.: 08/050,787

[22] Filed: Apr. 21, 1993

[51] Int. Cl.$^7$ .................................................. H01L 39/00
[52] U.S. Cl. ........................... 505/491; 505/492; 264/614
[58] Field of Search .................... 264/570, 104, 264/614; 505/492, 491, 501

[56] References Cited

U.S. PATENT DOCUMENTS

| | | | |
|---|---|---|---|
| 4,276,202 | 6/1981 | Schmidberger | 502/101 |
| 5,076,815 | 12/1991 | Kunz | 501/127 |
| 5,096,879 | 3/1992 | Arendt | 505/1 |
| 5,104,850 | 4/1992 | Provenzano et al. | 505/1 |
| 5,108,985 | 4/1992 | Iino et al. | 505/1 |
| 5,145,831 | 9/1992 | Yamada et al. | 505/1 |
| 5,149,687 | 9/1992 | Galasso | 505/1 |
| 5,187,327 | 2/1993 | Ohta et al. | 174/35 R |
| 5,205,971 | 4/1993 | Croft et al. | 264/86 |
| 5,236,471 | 8/1993 | Dijen | 501/127 |
| 5,324,712 | 6/1994 | Su | 505/492 |

OTHER PUBLICATIONS

Endo et al., "Composition Dependence on the Superconducting Properties of Bi–Pb–Sr–Ca–Cu–O", Japanese J. applied Physics 28 (2) pp. L190–L192 (Feb. 1989).

Hoshino et al., "Large Vessels of High-$T_c$ Bi Pb–Sr–Ca–Cu–O Superconductor for Magnetic Shield", Japanese J. Applied Physics 29 (8) pp. L1435–L1438 (Aug. 1990).

Koyama et al., "Preparation of the Single 110K Phase if the Bi Pb–Sr–Ca–Cu–O Superconductor", Japanese J. Applied Physics 27 (10 pp. L1861–L1863 (Oct. 1988).

*Primary Examiner*—Christopher A. Fiorilla
*Attorney, Agent, or Firm*—Thomas E. McDonnell; John J. Karasek

[57] ABSTRACT

A process for producing the 2223 phase of (Pb,Bi)SrCaCuO that is much faster than existing processes has the steps of: calcining a precursor powder mixture while maintaining intimate mixing of this precursor mixture by intermediate grindings during calcination; compressing the calcination product into a consolidated body; and heating the calcination product while maintaining intimate mixing of the calcination product, to form essentially phase pure 2223 (Pb,Bi)SrCaCu). A fast process for making a (Pb,Bi)SrCaCuO part with a high $J_c$ has the steps of: pressing calcined and reacted (Pb,Bi)SrCaCuO powder into a green body having the shaped of the part; and sintering the green body for a selected time, most preferably between 6 and 8 hours, that is long enough to establish superconducting electrical contact between grains of (Pb,Bi)SrCaCuO but short enough to prevent void formation or part shape distortion. The part made by this process has a high density, at least about 4 or 5 g/cm$^3$.

17 Claims, 4 Drawing Sheets

PROCESS FOR MAKING SUPERCONDUCTING PBSCCO AND PBSCCO PARTS

FIELD OF THE INVENTION

This invention relates to improving the production of 2223 (Pb,Bi)SrCaCuO powder and to improving the production of superconducting 2223 and 2212 (Pb,Bi)SrCaCuO parts to be used as, among other things, superconducting magnetic shields, vibrational dampeners, and bus bars.

DESCRIPTION OF THE RELATED ART (Pb,Bi)SrCaCuO is defined herein to be a composition comprising bismuth, strontium, calcium, copper, and oxygen with a superconducting transition at about 60K or 80K, or a composition comprising lead, bismuth, strontium, calcium, copper, and oxygen with a superconducting transition at about 110K, or mixtures thereof. The solid solution of (Pb,Bi)SrCaCuO with a $T_c$ of about 110K will be referred to herein as the 2223 phase of (Pb,Bi)SrCaCuO. The composition of (Pb,Bi)SrCaCuO (which may or may not contain lead) with $T_c$ of about 80K will be referred to herein as the 2212 phase of (Pb,Bi)SrCaCuO.

One of the goals of the superconducting art is to make shaped parts, such as shields, vibrational dampeners, and bus bars, out of high temperature superconductors. In particular, it is desired to make these parts out of the various high $T_c$ phases (2212 and 2223) of (Pb,Bi)SrCaCuO.

Efforts to make these shaped parts have encountered several problems. These parts generally experience some shape and size distortion, in the form of irregular and unwanted growth, during heat treatment. This necessitates some machining of the parts to make them the desired shape and size. Moreover, good (Pb,Bi)SrCaCuO platelet alignment has been difficult to achieve, resulting in poor values for the critical current density $J_c$.

With regard to the production of parts made from 2223 (Pb,Bi)SrCaCuO, and more generally to the production of 2223 (Pb,Bi)SrCaCuO, a consistent problem has been the notoriously slow conversion of (Pb,Bi)SrCaCuO from the 2212 phase to the 2223 phase. Converting the 2212 phase of (Pb,Bi)SrCaCuO into the 2223 phase generally requires between 100 hours to 200 hours or more. See U.S. Pat. No. 5,187,327, issued Feb. 16, 1993 to Ohta et al., and incorporated by reference herein.

SUMMARY OF THE INVENTION

Accordingly, it is an object of this invention to accelerate the production of 2223 (Pb,Bi)SrCaCuO.

It is a further object of this invention to make (Pb,Bi)SrCaCuO parts with higher density and platelet alignment; and hence higher $J_c$, by a fast process that minimizes part shape distortion.

These and additional objects of the invention are accomplished by the structures and process hereinafter described.

An improved process for making superconducting 2223 (Pb,Bi)SrCaCuO is carried out by calcining a precursor mixture for superconducting (Pb,Bi)SrCaCuO while maintaining intimate mixing of the precursor mixture, and heating the calcination product while maintaining intimate mixing until essentially all of this product is the 2223 phase of (Pb,Bi)SrCaCuO. An improved process for making a superconducting (Pb,Bi)SrCaCuO part is carried out by isostatically pressing (Pb,Bi)SrCaCuO powder into the shape of the part, and sintering the part for a time that is at least long enough for the part to fuse, but less than a time that will permit either significant void formation or significant part shape distortion to occur in the part. Parts made by this process have a density of at least about 4.0 g/cm³ or 5.0 g/cm³, and have their (Pb,Bi)SrCaCuO platelets aligned with their c axes essentially normal to the nearest part surface.

BRIEF DESCRIPTION OF THE DRAWINGS

A more complete appreciation of the invention will be readily obtained by reference to the following Description of the Preferred Embodiments and the accompanying drawings in which like numerals in different figures represent the same structures or elements, wherein.

DESCRIPTION OF THE PREFERRED EMBODIMENTS

Figure 1:
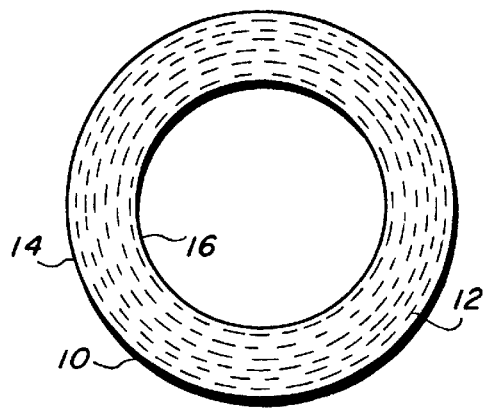
FIG. 1 shows a cross-section of a portion of a shaped (Pb,Bi)SrCaCuO part.

Both the 2212 and the 2223 phases of (Pb,Bi)SrCaCuO have a platelet morphology, similar to the mineral mica. When these platelets are in enhanced parallel alignment with each other, there is improved surface to surface contact between platelets. This results in improved coupling between the platelets, which in turn results in higher values for $J_c$. When these platelets form a part and are in enhanced parallel alignment with the surface of this part (i.e. where the c axes of the platelets are normal to the part surface), this results in beneficial electrical, magnetic, and machining properties. FIG. 1 shows a cross section of a cylindrical (Pb,Bi)SrCaCuO part 10 with (Pb,Bi)SrCaCuO platelets 12 aligned with each other and with adjacent part surfaces 14,16.

These platelets grow fastest parallel to their a and b axes (their long axes). In a part where the platelets are in enhanced parallel alignment with each other and with any adjacent part surface, the platelets will be less prone to "growing out" of the part, which causes part distortion.

It has been discovered that an excessively long sintering time results in excessive grain growth along the a and b axes of the platelets, which likewise in turn results in part distortion, especially when the platelets are not in enhanced alignment.

It has also been discovered that conversion of the 2212 phase into the 2223 phase also results in platelet growth. This growth is attributable to additional calcium and copper being integrated into the platelets. Platelet growth from this source can be avoided by sintering compositions where the conversion of the 2212 phase into the 2223 phase is nearly complete (within about 5% to about 10% of completion). Alternatively, platelet growth from this source can be avoided by working solely in the 2212 phase, i.e. working with essentially lead-free compositions that do not form the 2223 phase.

Consequently, to achieve the objects of this invention, it is desired to keep the growing platelets in enhanced parallel alignment, and to control the sintering time of the part formation. It is also desired to sinter compositions that are either essentially lead-free or compositions where the conversion of the 2212 phase into the 2223 phase is nearly complete. Since such platelets will necessarily have enhanced packing, monitoring the density of a (Pb,Bi)SrCaCuO part provides a way of monitoring the degree to which platelets are aligned in that part.

The 2223 phase of (Pb,Bi)SrCaCuO has a higher $T_c$ than the 2212 phase. Consequently, 2223 is the preferred phase for many applications. However, as noted above, the slow conversion of the 2212 phase to the 2223 phase has been a barrier to implementing 2223 (Pb,Bi)SrCaCuO in devices.

It has been discovered that the time needed to convert 2212 (Pb,Bi)SrCaCuO into 2223 (Pb,Bi)SrCaCuO can be dramatically reduced by maintaining a fine particle size ($\leq 10$ $\mu$m along the a and b axes) both during calcining, and during subsequent heat treatments. This results in maintaining intimate mixing of the precursor mixture and the calcination product, respectively. This fine particle size is readily achieved by periodically grinding the reacting (Pb,Bi)SrCaCuO during both calcination and subsequent heating. Periodic grinding during calcination preferably entails grinding before calcination and at least once at an intermediate time. Periodic grinding during subsequent heat treatment preferably entails grinding the calcination product at least once at an intermediate time. Available methods for grinding include ball milling, attrition milling, and jet milling. Ball milling is the preferred method for grinding during calcination and subsequent heat treatments, due to its low costs for equipment and energy. Jet milling, which involved smashing together streams of powder or slurry under carefully controlled conditions, is a difficult process to carry out and thus is less preferred. Attrition milling is also less preferred, due to its higher energy requirements relative to ball milling.

Preferably, the calcination step is carried out at between about 800° C. and about 820° C. There are several methods of calcination available. For example, the superconductor may be calcined by the co-decomposition of metal nitrates method. In this method, near-stoichiometric amounts of metal oxides and carbonates ($Bi_2O_3$, PbO or $Pb(NO_3)_2$, $SrCO_3$ or $Sr(NO_3)_2$, $CaCO_3$, and CuO) are dissolved in nitric acid, and this solution is then dried and calcined. Two particularly favorable starting compositions for this method are $Bi_{1.84}Pb_{0.34}Sr_{1.91}Ca_{2.03}Cu_{3.06}$ and $Bi_{1.84}Pb_{0.34}Sr_{1.97}Ca_{1.97}Cu_{3.06}$. Alternatively, metal carbonates can be calcined instead of the metal oxides, but this method is less preferred.

It should be noted that Pb is preferably only included in the precursor mixture when 2223 (Pb,Bi)SrCaCuO is the desired product. When the desired product is 2212 (Pb,Bi)SrCaCuO, preferably all the (Pb,Bi) sites will be occupied by Bi.

The product of this calcining step is a multiphase system comprising at least some 2212 phase. Possibly, some 2223 may also be present. In the co-decomposition of metal nitrates method, calcination is complete when essentially all of the nitrates have decomposed. Typically, calcination for between about 30 minutes and about 90 minutes will achieve this result, when there is at least one intermediate grinding carried out during the calcination.

After calcination, it is generally necessary to heat treat the calcination product to convert essentially all of the product to the 2223 phase. Typically this will require between about 20 hours and about 28 hours heating time after calcination, when this process is carried out according to this invention. This contrasts with the 100 to 200 hours required to convert the 2212 phase to the 2223 phase by known methods.

Figure 2:
FIG. 2 shows a compressed pellet of calcined precursor mixture.

Preferably, as shown in FIG. 2, the calcination product is compressed into a consolidated body (pellet, bar, etc.) 18 before post-calcination heat treatment. This compression preferably is done under a pressure between about 3 and 10 kpsi. Most preferably, this compression is done under a pressure between about 5 and 7 kpsi. By consolidating the calcination product, the component species are brought into closer physical proximity, and the conversion from the 2212 phase into the 2223 phase is accelerated.

Preferably, a fine particle size is maintained during this heating step. Preferably this is done by periodically grinding the reacting (Pb,Bi)SrCaCuO. Preferably, the calcined powder is re-compressed into a consolidated body after each re-grinding during this heating step.

Preferably, this heating step is done under a gas with a volume ratio of $O_2/N_2$ of between about 1/5 (i.e. air) and about 1/13. Preferably, this is done under flowing gas containing $O_2$. If the $O_2$ content is too high, the growth of the 2223 phase is inhibited. If the $O_2$ content is too low, the composition tends to melt at lower temperatures, shrinking the processing window.

Preferably, the calcined powder is heated at between about 840° C. and about 860° C. Production of 2223 (Pb,Bi)SrCaCuO according to this process is accelerated from requiring 100 to 200 hours (or more) to requiring less than 30 hours.

A superconducting (Pb,Bi)SrCaCuO part 10 is made according to this invention by pressing (Pb,Bi)SrCaCuO powder into a green body having the shape of the part 10, and sintering the green body for a selected time, where this time is long enough for the part to fuse, so that there is superconducting electrical contact between grains of (Pb,Bi)SrCaCuO 12 in the part, but less than a time that will permit either significant void formation or significant part shape distortion to occur. This void formation and part shape distortion is attributable to excessive grain growth along the a and b axes of misaligned (Pb,Bi)SrCaCuO grains. As these grains grow, the growing edges intersect with the flat surfaces of nearby platelets, forcing these nearby platelets outward.

Pressing the part 10 urges the (Pb,Bi)SrCaCuO platelets 12 into alignment, with their c axes parallel to the direction of the applied force. Preferably, the part is isostatically pressed, to urge the platelets into conformal alignment. Preferably, the part is pressed at between about 20,000 lbs/in$^2$ (20 kpsi) and about 90 kpsi. More preferably, the part is initially isostatically pressed at about 50 kpsi, and then finally pressed at about 70 kpsi. However, pressing even under much lower pressure will achieve some enhanced alignment.

Pressures in excess of 90 kpsi tend to crush platelets 12 into smaller than preferred size. Platelets that are too small are less preferred because the $J_c$ of a part depends upon, among other factors, the average distance current can travel within a (Pb,Bi)SrCaCuO grain (i.e. the average grain size along the a and b axes). Furthermore, pressures in excess of 90 kpsi actually inhibits grains from slipping past each other into preferred enhanced parallel alignment, by "locking" the platelets into position. Also, excessively high pressures tend to push the (Pb,Bi)SrCaCuO grains into the rubber isostatic mold. On the other hand, pressures below 30 kpsi are less able to efficiently urge the (Pb,Bi)SrCaCuO platelets into enhanced parallel alignment.

Figure 3:
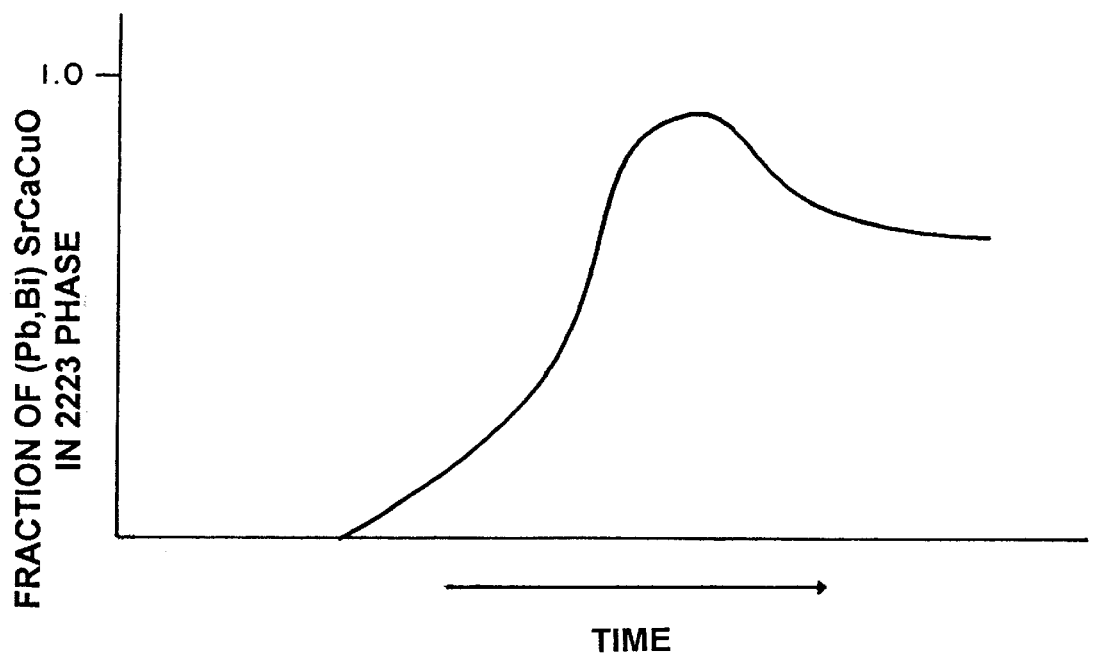
FIG. 3 shows a time-composition profile for 2223 (Pb,Bi)SrCaCuO.

Preferably, the powder is very finely ground before it is isostatically pressed. This is preferably done by attrition milling. Preferably, the powder comprises nearly all 2223 (Pb,Bi)SrCaCuO, with very little (not more than about 5% to 10%) 2212 phase. However, it is preferred to have at least some 2212 phase in the powder to be pressed, to prevent the subsequent sintering step from causing a deleterious back-reaction from the 2223 phase back to the 2212 phase. As shown in FIG. 3, as a sample of (Pb,Bi)SrCaCuO is heated, the fraction of 2223 increases with time, then gradually decreases again. The conversion of the 2212 phase to the 2223 phase is a reversible reaction, and heating a composition of essentially phase pure 2223 (Pb,Bi)SrCaCuO will gradually cause the degradation of the 2223 phase, and the formation of 2212 phase and other phases. This back reaction can have a range of deleterious effects, including formation of the less preferred 2212 phase, formation of calcium and copper inclusions in the superconducting matrix, and potentially some part shape distortion.

Preferably, the pressed part is sintered for between about 1 hour and about 12 hours. More preferably, the pressed part is sintered for between about 4 hours and about 10 hours. Most preferably, the pressed part is sintered for between about 6 hours and about 8 hours.

Preferably, the pressed part is sintered at a temperature between about 825° C. and about 875° C. Most preferably, the pressed part is sintered at a temperature between about 840° C. and about 860° C.

Improper sintering will generally cause the deleterious effects on $J_c$ and part shape described above. There is also the additional disadvantage to improper sintering of back-reaction to the 2212 phase, which is discussed above.

Both 2212 and 2223 parts can be made by this process. Parts with densities well in excess of 4 or 5 g/cm$^3$, indicative of superior platelet alignment, can be achieved readily by this process.

Having described the invention the following examples are given to illustrate specific applications of the invention, including the best mode now known to perform the invention. These specific examples are not intended to limit the scope of the invention described in this application.

EXAMPLES

Example 1

Preparation of 2223 (Pb,Bi)SrCaCuO by Co-Decomposition of Metal Nitrates

Near-stoichiometric amounts of $Bi_2O_3$, PbO, $SrCO_3$, $CaCO_3$, and CuO were dissolved in nitric acid to form a solution of metal nitrates with cation proportions of $Bi_{1.84}Pb_{0.34}Sr_{1.91}Ca_{2.03}Cu_{3.06}$. This solution was dried in a glass beaker by heating on a hot plate. The powder was then ground using a mortar and pestle. The nitrate powder was co-decomposed (calcined) at 800° C. for 30 minutes, and ground with a mortar and pestle. The powder was calcined again at 820° C. for 30 minutes, and then ground using a mortar and pestle. The purpose of these calcination steps was to completely decompose the metal nitrates into a multiphase system including at least some 2212 (Pb,Bi)SrCaCuO.

The calcined powder was uniaxially pressed into a pellet with about 7 kpsi pressure, and reacted at 850° C. for 12 hours in flowing 1/13 $O_2/N_2$. The heat-treated pellet was ground using a mortar and pestle, uniaxially pressed into a pellet again, and fired again under the same conditions, to form essentially phase pure 2223 (Pb,Bi)SrCaCuO.

Figure 4:
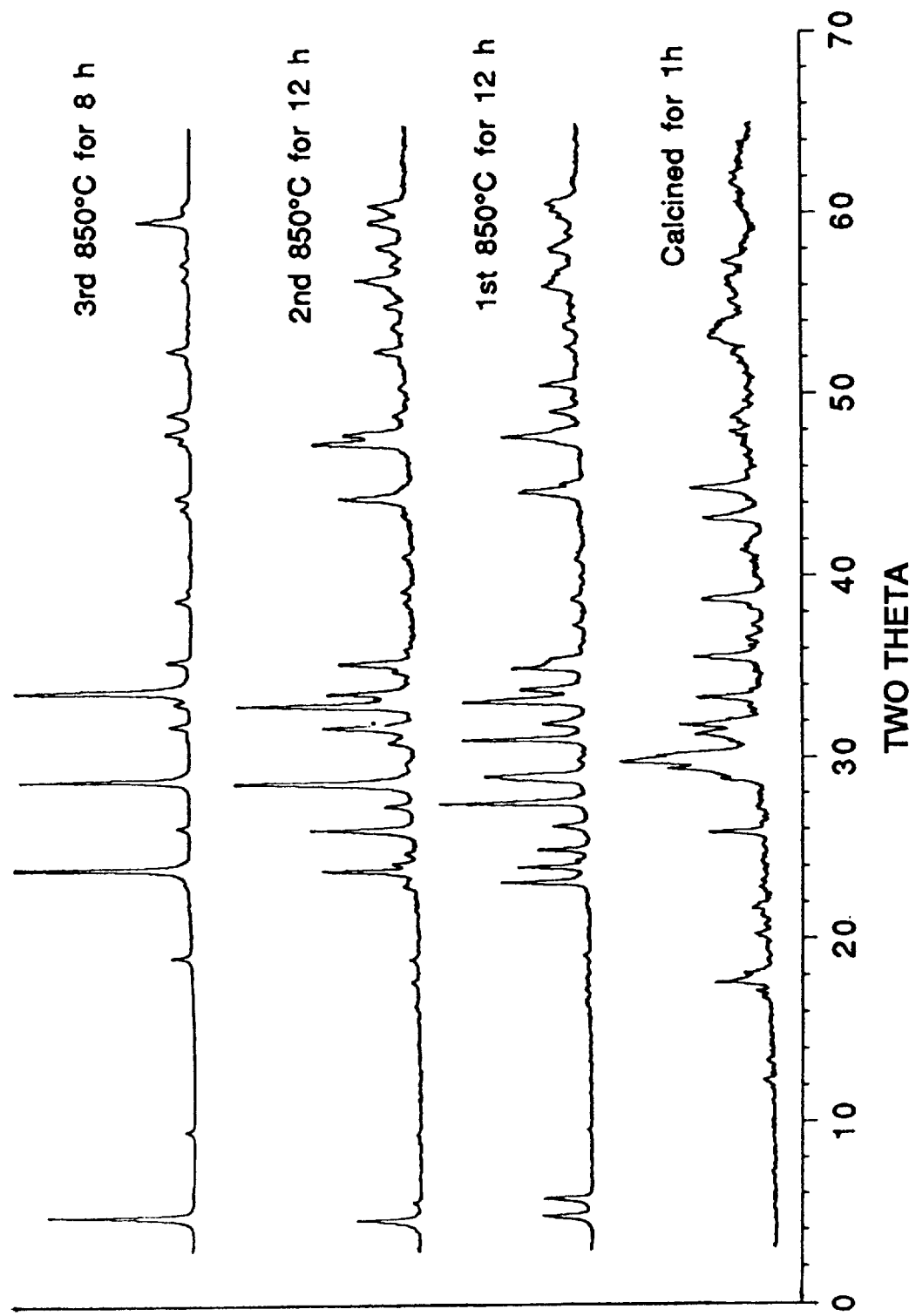
FIG. 4 shows a series of X-ray plots for a (Pb,Bi)SrCaCuO sample after a calcination and a series of heat treatments.

The x-ray diffraction plots shown in FIG. 4 were prepared after calcination (bottom plot), and after each of the subsequent heat treatment (second and third plots from the bottom). It is evident from these plots that after the second 12 hour heat treatment, the sample consists of essentially phase pure 2223 (Pb,Bi)SrCaCuO.

Example 2

Preparation of 2223 (Pb,Bi)SrCaCuO by Co-Decomposition of Metal Nitrates

The product of Example 1 was reground using a mortar and pestle, and uniaxially pressed into a pellet again. This pellet was fired again at 850° C. for 8 hours.

The top plot in FIG. 4 shows that after this third heat treatment at 850° C., not even a small peak of 2212 (Pb,Bi)SrCaCuO is observed.

Example 3

Preparation of 2223 (Pb,Bi)SrCaCuO by Co-Decomposition of Metal Nitrates

Example 1 was repeated, with cations in proportions of $Bi_{1.84}Pb_{0.34}Sr_{1.97}Cu_{3.06}$. Essentially phase pure 2223 (Pb, Bi)SrCaCuO was produced.

Example 4

Preparation of a Superconducting 2223 (Pb,Bi) SrCaCuO Bus Bar

Figure 5:
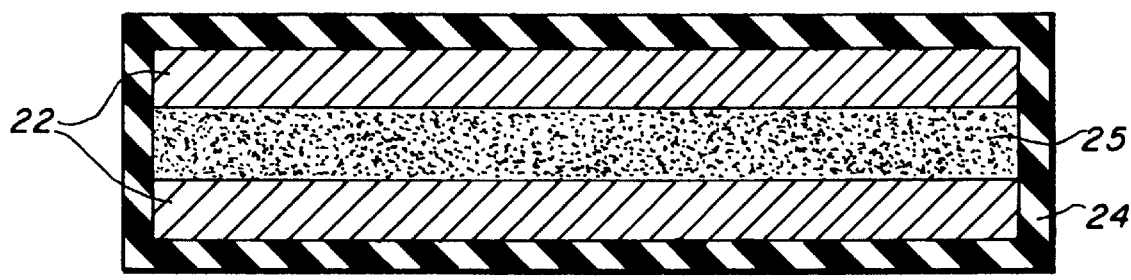
FIG. 5 shows a setup for isostatically pressing a (Pb,Bi)SrCaCuO bus bar.

The sample prepared in Example 1 was attrition milled in propanol for 1 hour and dried at 100° C. The powder was then uniaxially pressed at 30 kpsi into a bus bar 25 (5.0 cm×0.5 cm×0.1 cm), shown in FIG. 5. This bus bar 25 was placed between two aluminum bars 22 of the same size. This "sandwich" was then sealed in a rubber bag 24 and isostatically pressed at 70 kpsi. Due to the geometry (aspect ratio) of the bus bar, this isostatic pressing was essentially equivalent to uniaxial pressing. The bus bar was then removed from the press and sintered at 850° C. for 8 hours in flowing 1/13 $O_2/N_2$.

Adding the firing time required to prepare the 2223 powder (25 hours) to the firing time required to form the bus bar from the powder (8 hours), a total firing time to make shaped 2223 parts with high $J_c$ of only 33 hours, compared to about 120 to 220 hours of firing time by other methods.

The density of this product was 5.9 g/cm$^2$. There was no more than 20 $\mu$m distortion in the "flatness" of the bar, measured on the 5.0×0.5 face of the bar, from the center of the bar to the end.

Example 5

Figure 6:
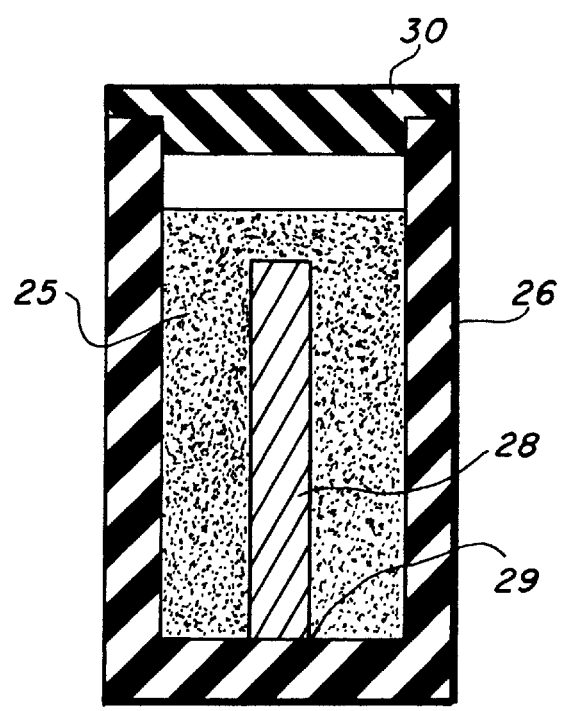
FIG. 6 shows a setup for isostatically pressing a (Pb,Bi)SrCaCuO cylinder.
Figure 7:
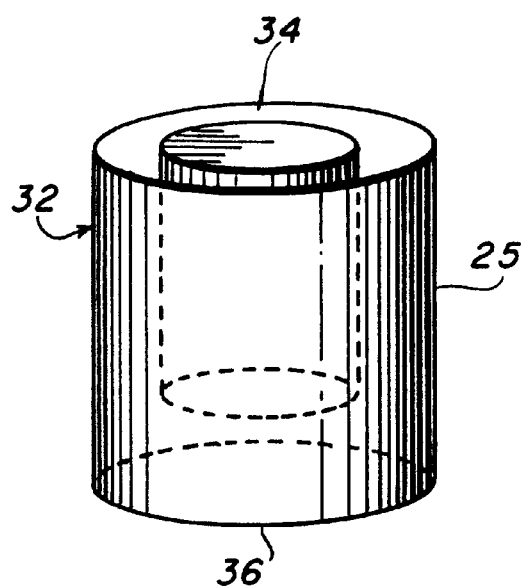
FIG. 7 shows a cylindrical (Pb,Bi)SrCaCuO part with one open end.

Preparation of a Cylindrical Superconducting 2223 (Pb,Bi)SrCaCuO Magnetic Shield The sample prepared in Example 3 was attrition milled in propanol for 1 hour and dried at 100° C. As shown in FIG. 6, the powder 25 was then poured into a cylindrical rubber mold 26 having an axial steel rod 28 fixed to the bottom 29 of the mold 26. The powder was tapped down into the mold to assure good packing of the powder, and was added in sufficient quantity to cover the steel rod. The mold 26 was sealed with a rubber cap 30 and isostatically pressed at 70 kpsi, to make a hollow cylinder 32, shown in FIG. 7, having one open end 34 and one closed end 36. The cylinder was removed from the mold and the rod was removed from the cylinder. The cylinder was sintered at 850° C. for 8 hours in flowing $\frac{1}{13}$ $O_2/N_2$.

Example 6

Preparation of a Cylindrical Superconducting 2223 (Pb, Bi)SrCaCuO Conductor

Figure 8:
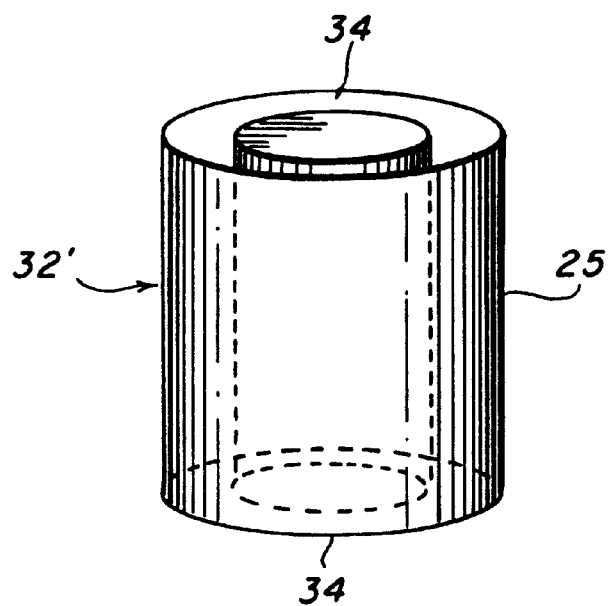
FIG. 8 shows a cylindrical (Pb,Bi)SrCaCuO part with two open ends.

Example 5 was repeated, except that less powder 25 was added to the mold 26, so that a hollow cylinder 32' with two open ends 34 was made, as shown in FIG. 8.

Example 7

Preparation of 2223 (Pb,Bi)SrCaCuO by Decomposition of Metal Carbonates

Near-stoichiometric amounts of $Bi_2O_3$, PbO, $SrCO_3$, $CaCO_3$, and CuO were ground with a mortar and pestle, to form a powder mixture with cation proportions of $Bi_{1.84}Pb_{0.34}Sr_{1.91}Ca_{2.03}Cu_{3.06}$. This powder mixture was calcined 6 time at temperatures ranging from 820° C. to 825° C., with regrindings between each calcination step. Each calcination step lasted 1 hour. The purpose of these calcination steps was to completely decompose the metal nitrates into a multiphase system including at least some 2212 (Pb,Bi)SrCaCuO.

The calcined powder was uniaxially pressed into a pellet with about 7 kpsi pressure, and reacted at 860° C. for 12 hours in flowing $\frac{1}{13}$ $O_2/N_2$. The heat-treated pellet was ground using a mortar and pestle, uniaxially pressed into a pellet again, and fired again under the same conditions. The product of this step was ground again using a mortar and pestle, uniaxially pressed into a pellet again, and fired again under the same conditions, for a total of 3 post-calcination heat treatments. The product of this process was essentially phase pure 2223 (Pb,Bi)SrCaCuO.

Obviously, many modifications and variations of the present invention are possible in light of the above teachings. It is therefore to be understood that, within the scope of the appended claims, the invention may be practiced otherwise than as specifically described.

What is claimed is:

1. A process for making a superconducting (Pb,Bi)SrCaCuO part having a shape, comprising the steps of:
    pressing (Pb,Bi)SrCaCuO powder into a green body having the shape of said part;
    sintering said green body for a time that is at least long enough for said part to fuse so that there is superconducting electrical contact between grains of (Pb,Bi)SrCaCuO in said part, but less than a time that will permit either significant void formation or significant part shape distortion to occur, wherein said sintering step comprises sintering said green body for between about 4 hours and about 10 hours, and wherein said (Pb,Bi)SrCaCuO powder comprises a phase of superconducting (Pb,Bi)SrCaCuO selected from the group consisting of 2212 (Pb,Bi)SrCaCuO, 2223 (Pb,Bi)SrCaCuO, and mixtures thereof.

2. The process of claim 1, wherein said step of pressing (Pb,Bi)SrCaCuO powder comprises isostatically pressing essentially phase pure (Pb,Bi)SrCaCuO powder.

3. The process of claim 1, wherein said step of pressing (Pb,Bi)SrCaCuO powder comprises isostatically pressing essentially phase pure 2223 (Pb,Bi)SrCaCuO powder.

4. The process of claim 1, wherein said step of pressing (Pb,Bi)SrCaCuO powder comprises isostatically pressing essentially phase pure 2212 (Pb,Bi)SrCaCuO powder.

5. The process of claim 1, wherein said step of pressing (Pb,Bi)SrCaCuO powder comprises pressing said powder at between about 20,000 lbs/in$^2$ and about 90,000 lbs/in$^2$.

6. The process of claim 1, wherein said sintering step comprises sintering said green body for between about 6 hours and about 8 hours.

7. The process of claim 1, wherein said sintering step comprises sintering said green body at between at between about 825° C. and about 875° C.

8. The process of claim 1, wherein said sintering step comprises sintering said green body at between about 840° C. and about 860° C.

9. The process of claim 1, wherein said (Pb,Bi)SrCaCuO powder is attrition milled (Pb,Bi)SrCaCuO powder.

10. The process of claim 1, wherein said (Pb,Bi)SrCaCuO powder comprises not more than about 10% 2212 (Pb,Bi)SrCaCuO.

11. The process of claim 1, wherein said sintering said green body comprises sintering said green body in an atmosphere comprising less than $\frac{1}{5}$ $O_2$.

12. The process of claim 1, wherein said sintering said green body comprises sintering said green body in an atmosphere comprising a volume ratio of $O_2/N_2$ of about $\frac{1}{13}$.

13. A process for making a superconducting (Pb,Bi)SrCaCuO having a shape comprising the steps of:
    calcining a precursor mixture for superconducting (Pb,Bi)SrCaCuO until essentially all of said precursor has decomposed to form a multiphase system, while maintaining intimate mixing of said precursor mixture during said calcining step;
    compressing the product of said calcination step;
    heating the compressed calcination product and maintaining intimate mixing of said calcination product until essentially all of said calcination product comprises 2223 phase (Pb,Bi)SrCaCuO;
    forming 2223 (Pb,Bi)SrCaCuO powder from said heating product;
    pressing said 2223 (Pb,Bi)SrCaCuO powder into a green body having the shape of said part;
    sintering said green body for between about 4 and about 10 hours so that there is superconducting electrical contact between grains of (Pb,Bi)SrCaCuO in said part, but less than a time that will permit either significant void formation or significant part shape distortion to occur.

14. The process of claim 13, wherein said sintering step comprises sintering said green body for between about 6 hours and about 8 hours.

15. The process of claim 13, wherein said sintering step comprises sintering said green body at a temperature of between about 825° C. and about 860° C.

16. The process of claim 13, wherein said sintering step comprises sintering said green body at a temperature of between about 840° C. and about 860° C.

17. A process for making a superconducting (Pb,Bi)SrCaCuO part having a shape, comprising the steps of:
    pressing (Pb,Bi)SrCaCuO powder into a green body having the shape of said part;
    sintering said green body for a time that is at least long enough for said part to fuse so that there is superconducting electrical contact between grains of (Pb,Bi)SrCaCuO in said part, but less than a time that will permit either significant void formation or significant part shape distortion to occur, wherein said sintering step comprises sintering said green body for more than about 4 hours but less than about 10 hours, and wherein said (Pb,Bi)SrCaCuO powder comprises a phase of superconducting (Pb,Bi)SrCaCuO selected from the group consisting of 2212 (Pb,Bi)SrCaCuO, 2223 (Pb,Bi)SrCaCuO, and mixtures thereof.

* * * * *